(12) United States Patent
Adriano et al.

(10) Patent No.: US 9,806,008 B1
(45) Date of Patent: Oct. 31, 2017

(54) CLIP BASED SEMICONDUCTOR PACKAGE FOR INCREASING EXPOSED LEADS

(71) Applicant: Infineon Technologies Americas Corp., El Segundo, CA (US)

(72) Inventors: Gerald Adriano, Temecula, CA (US); Sam Lalgudi Sundaram, Tarzana, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/182,092

(22) Filed: Jun. 14, 2016

(51) Int. Cl.
*H01L 23/495* (2006.01)
*H01L 23/31* (2006.01)
*H01L 25/16* (2006.01)
*H01L 23/00* (2006.01)

(52) U.S. Cl.
CPC .... *H01L 23/49562* (2013.01); *H01L 23/3107* (2013.01); *H01L 23/49575* (2013.01); *H01L 24/49* (2013.01); *H01L 25/16* (2013.01); *H01L 2224/48137* (2013.01); *H01L 2224/48245* (2013.01); *H01L 2924/01047* (2013.01); *H01L 2924/13055* (2013.01); *H01L 2924/13064* (2013.01); *H01L 2924/13091* (2013.01); *H01L 2924/1426* (2013.01); *H01L 2924/17747* (2013.01)

(58) Field of Classification Search
CPC .................................................. H01L 23/49541
See application file for complete search history.

(56) References Cited

U.S. PATENT DOCUMENTS

| | | | |
|---|---|---|---|
| 7,095,113 B2 * | 8/2006 | Xiaochun | H01L 23/49541 257/678 |
| 8,067,273 B2 | 11/2011 | Gomez | |
| 9,006,870 B2 * | 4/2015 | Zhang | H01L 23/49534 257/675 |

\* cited by examiner

*Primary Examiner* — Yu-Hsi D Sun
(74) *Attorney, Agent, or Firm* — Shumaker & Sieffert, P.A.

(57) ABSTRACT

A semiconductor package includes a leadframe having a clip foot portion, the clip foot portion having a first tie bar, a conductive clip situated over the leadframe, the conductive clip including a first lock fork having at least two prongs around the first tie bar so as to secure the conductive clip to the clip foot portion of the leadframe. The conductive clip includes a second lock fork having at least two prongs around a second tie bar of the clip foot portion. The conductive clip is electrically coupled to the clip foot portion of the leadframe. The clip foot portion of the leadframe includes exposed leads. The semiconductor package also includes at least one semiconductor device situated on the leadframe. The at least one semiconductor device is coupled to a driver integrated circuit situated on the leadframe.

19 Claims, 6 Drawing Sheets

CLIP BASED SEMICONDUCTOR PACKAGE FOR INCREASING EXPOSED LEADS

BACKGROUND

Packages combining several semiconductor devices can simplify circuit design, reduce costs, and provide greater efficiency and improved performance by keeping related and dependent circuit components in close proximity. Furthermore, these packages can facilitate application integration and greater electrical and thermal performance compared to using separate packaging for components.

In conventional clip based packages, a top clip has a tendency to rotate with respect to a bottom leadframe due to vibration and other factors, for example, during the fabrication process. Such rotation is undesirable because it can cause contact points between the clip and one or more semiconductor dies below the clip to completely lose or have intermittent electrical connection. In one conventional clip based package design, a clip has a protrusion metal on each end of a bent clip area. The protrusion metals of the clip are configured to fit in through-holes along one side of a leadframe to prevent the clip from rotating. However, designating areas on the leadframe for through-holes can undesirably reduce the area of leads, such as exposed fused leads, along the side of the leadframe, thereby adversely limiting the current carrying capability and connectivity of the clip based package.

Accordingly, there is a need to overcome the drawbacks and deficiencies in the art by providing a clip based semiconductor package that can secure a conductive clip to a leadframe to prevent clip rotation and allow a maximum area for exposed leads.

SUMMARY

The present disclosure is directed to a clip based semiconductor package for increasing exposed leads substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1A:
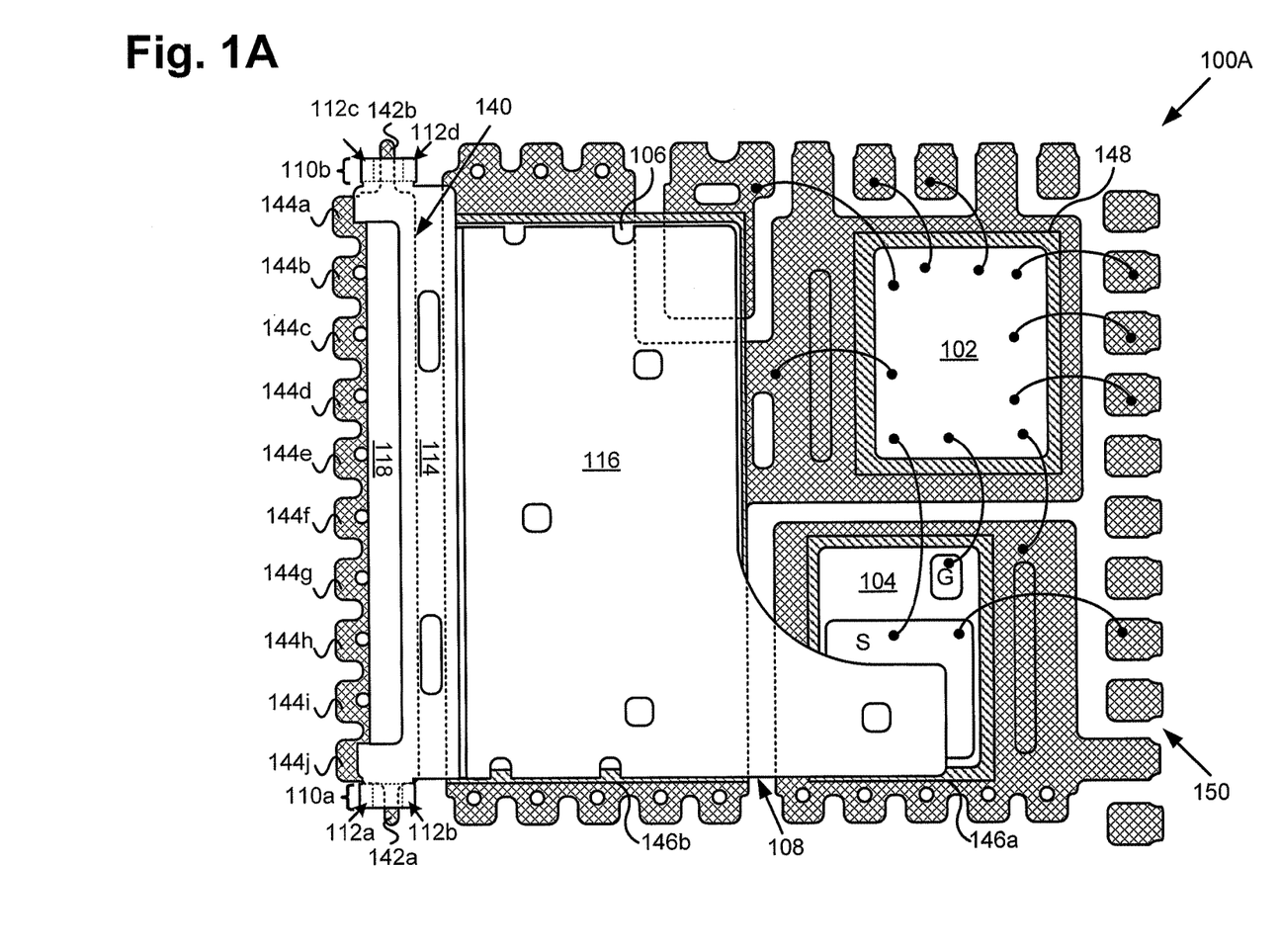
FIG. 1A illustrates a top-plan view of a semiconductor package according to one implementation of the present application.

Referring to FIG. 1A, FIG. 1A illustrates a top-plan view of a semiconductor package according to one implementation of the present application. As illustrated in FIG. 1A, semiconductor package 100A includes driver integrated circuit (IC) 102, semiconductor device 104, semiconductor device 106, conductive clip 108, and leadframe 150 having clip foot portion 140, high-side portion 146a, low-side portion 146b, and driver IC portion 148. Driver IC 102, semiconductor device 104 and semiconductor device 106 are situated on driver IC portion 148, high-side portion 146a and low-side portion 146b, respectively, of leadframe 150. Conductive clip 108 includes substantially flat portion 116 situated over semiconductor devices 104 and 106, and bent portion 118 coupled to clip foot portion 140 of leadframe 150, where substantially flat portion 116 and bent portion 118 are coupled to each other through side foot lock portion 114. Semiconductor package 100A also includes bond wires for interconnecting driver IC 102, semiconductor devices 104 and 106 and various I/O terminals, and a mold compound (not explicitly shown in FIG. 1A) encapsulating driver IC 102, semiconductor device 104, semiconductor device 106, conductive clip 108, leadframe 150 and the bond wires.

In the present implementation, leadframe 150 can include a material with high thermal and electrical conductivity, such as copper or copper (Cu) alloy. The top-side leadframe 150 can be selectively plated with materials for enhanced adhesion to device dies and bond wires. The plating can include silver (Ag) plating that is selectively applied to leadframe 150. In the present implementation, leadframe 150 is a dual-gauge leadframe, where portions of leadframe 150 retain a full thickness thereof, while the remaining portions of leadframe 150 retain a fraction (e.g., half-etched or quarter-etched) of the full thickness. The portions of leadframe 150 with the full thickness can remain exposed at its bottom-side after the mold compound encapsulates semiconductor package 100A, thereby reducing thermal resistance and improving thermal performance of semiconductor package 100A.

As illustrated in FIG. 1A, clip foot portion 140 is situated along one peripheral edge of leadframe 150. Clip foot portion 140 includes tie bars 142a and 142b on opposing ends thereof. Clip foot portion 140 also includes exposed leads 144a, 144b, 144c, 144d, 144e, 144f, 144g, 144h, 144i and 144j (hereinafter collectively referred to as exposed leads 144) between tie bars 142a and 142b for external connection. In addition, leadframe 150 includes other exposed leads and I/O terminals along the other three peripheral edges.

As illustrated in FIG. 1A, driver IC 102, semiconductor device 104 and semiconductor device 106 are electrically and mechanically connected to driver IC portion 148, high-side portion 146a and low-side portion 146b, respectively, of leadframe 150. This can be accomplished utilizing solder, conductive adhesive, and/or plating of leadframe 150. In the present implementation, driver IC 102 is configured to drive and control switching of semiconductor devices 104 and 106, which may correspond to a high-side switch and a low-side switch, respectively, of a half-bridge, for example. Driver IC 102 is situated on driver IC portion 148 of leadframe 150. Semiconductor device 104 and semiconductor device 106 are situated on high-side portion 146a and low-side portion 146b, respectively, of leadframe 150. Driver IC 102 and semiconductor devices 104 and 106 may be connected utilizing conductive clip 108, leadframe 150, and bond wires. It is noted that any particular connection shown can utilize one or more bond wires.

In the present implementation, semiconductor device 104 includes a power terminal (e.g., a source terminal) and a control terminal (e.g., a gate terminal) on a top surface thereof, and another power terminal (e.g., a drain terminal), not explicitly shown in FIG. 1A, on a bottom surface thereof. Semiconductor device 106 includes a power terminal (e.g., a drain terminal) on a top surface thereof, and another power terminal (e.g., a source terminal) and a control terminal (e.g., a gate terminal), which are not explicitly shown in FIG. 1A, on a bottom surface thereof. The power terminal (e.g., the source terminal) on the top surface of semiconductor device 104 is electrically coupled to the power terminal (e.g., the drain terminal) on the top surface of semiconductor device 106 through substantially flat portion 116 of conductive clip 108, for example.

As illustrated in FIG. 1A, conductive clip 108 is situated over leadframe 150, and coupled to clip foot portion 140 of leadframe 150. Conductive clip 108 can include a material with high thermal and electrical conductivity, such as copper or copper (Cu) alloy. Conductive clip 108 includes side foot lock portion 114 situated over clip foot portion 140 of leadframe 150. Side foot lock portion 114 includes lock forks 110a and 110b on the opposing ends thereof. As illustrated in FIG. 1A, lock fork 110a includes prongs 112a and 112b around tie bar 142a so as to secure conductive clip 108 to clip foot portion 140 of leadframe 150. Similarly, lock fork 110b includes prongs 112c and 112d around tie bar 142b so as to secure conductive clip 108 to clip foot portion 140 of leadframe 150. As such, the contact points between conductive clip 108 and semiconductor devices 104 and/or 106 would not lose electrical connection due to clip rotation.

In contrast to a conventional clip based package, in which protrusion metals of a clip are configured to fit in through-holes in a leadframe, semiconductor package 100A utilizes tie bars 142a and 142b and lock forks 110a and 110b to secure conductive clip 108 to clip foot portion 140 of leadframe 150, which prevent conductive clip 108 from rotating and eliminate through-holes in conventional design, thereby allowing a maximum number of exposed leads 144 to be formed on clip foot portion 140 of leadframe 150.

Figure 1B:
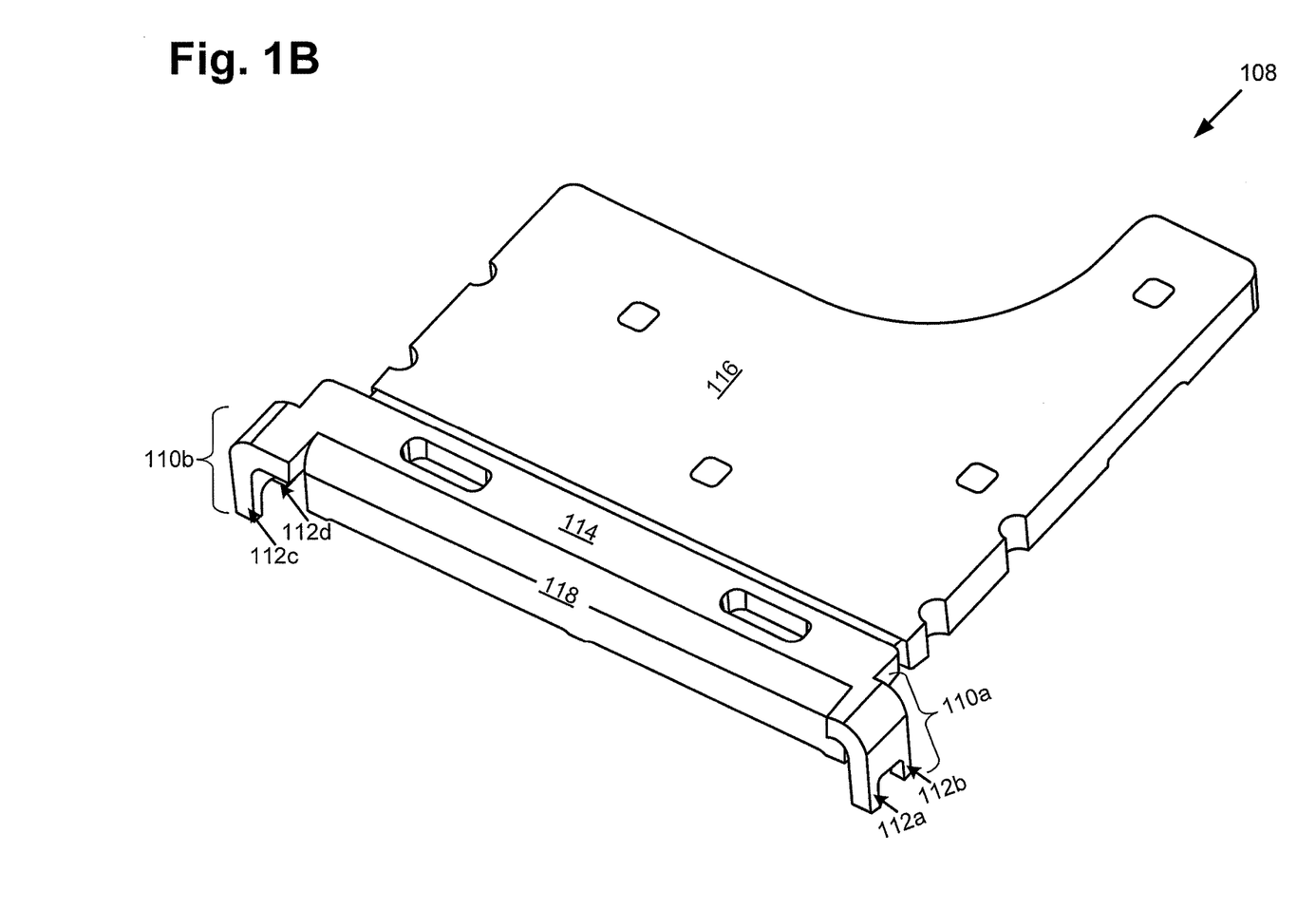
FIG. 1B illustrates a perspective view of a conductive clip of a semiconductor package according to one implementation of the present application.

Referring to FIG. 1B, FIG. 1B illustrates a perspective view of a conductive clip of a semiconductor package according to one implementation of the present application. As illustrated in FIG. 1B, with similar numerals representing similar features in FIG. 1A, conductive clip 108 includes substantially flat portion 116 and bent portion 118, where substantially flat portion 116 and bent portion 118 are coupled to each other through side foot lock portion 114. Side foot lock portion 114 includes lock fork 110a on one end and lock fork 110b on the opposite end of side foot lock portion 114. Substantially flat portion 116 of conductive clip 108 is configured to electrically and mechanically couple a power terminal (e.g., a source terminal) on the top surface of semiconductor device 104 to a power terminal (e.g., a drain terminal) on the top surface of semiconductor device 106. Also, substantially flat portion 116, side foot lock portion 114 and bent portion 118 are configured to provide a continuous conductive path to couple a circuit node between semiconductor devices 104 and 106, such as a switched node in a half bridge, to clip foot portion 140 of leadframe 150, which includes exposed leads 144 for external connection.

As illustrated in FIG. 1B, on one end of side foot lock portion 114, lock fork 110a includes prongs 112a and 112b which bend downward, for example, toward tie bar 142a of leadframe 150 in FIG. 1A. Prongs 112a and 112b are substantially perpendicular to substantially flat portion 116 of conductive clip 108, where the space between prongs 112a and 112b are configured to secure conductive clip 108 to tie bar 142a and prevent conductive clip 108 from rotating with respect to leadframe 150, for example. As illustrated in FIG. 1A, prongs 112a and 112b of lock fork 110a are around tie bar 142a so as to secure conductive clip 108 to clip foot portion 140 of leadframe 150.

Similarly, on the opposite end of side foot lock portion 114, lock fork 110b includes prongs 112c and 112d which bend downward, for example, toward tie bar 142b of leadframe 150 in FIG. 1A. Prongs 112c and 112d are substantially perpendicular to substantially flat portion 116 of conductive clip 108, where the space between prongs 112c and 112d are configured to secure conductive clip 108 to tie bar 142b and prevent conductive clip 108 from rotating with respect to leadframe 150, for example. As illustrated in FIG. 1A, prongs 112c and 112d of lock fork 110b are around tie bar 142b so as to secure conductive clip 108 to clip foot portion 140 of leadframe 150.

Figure 1C:
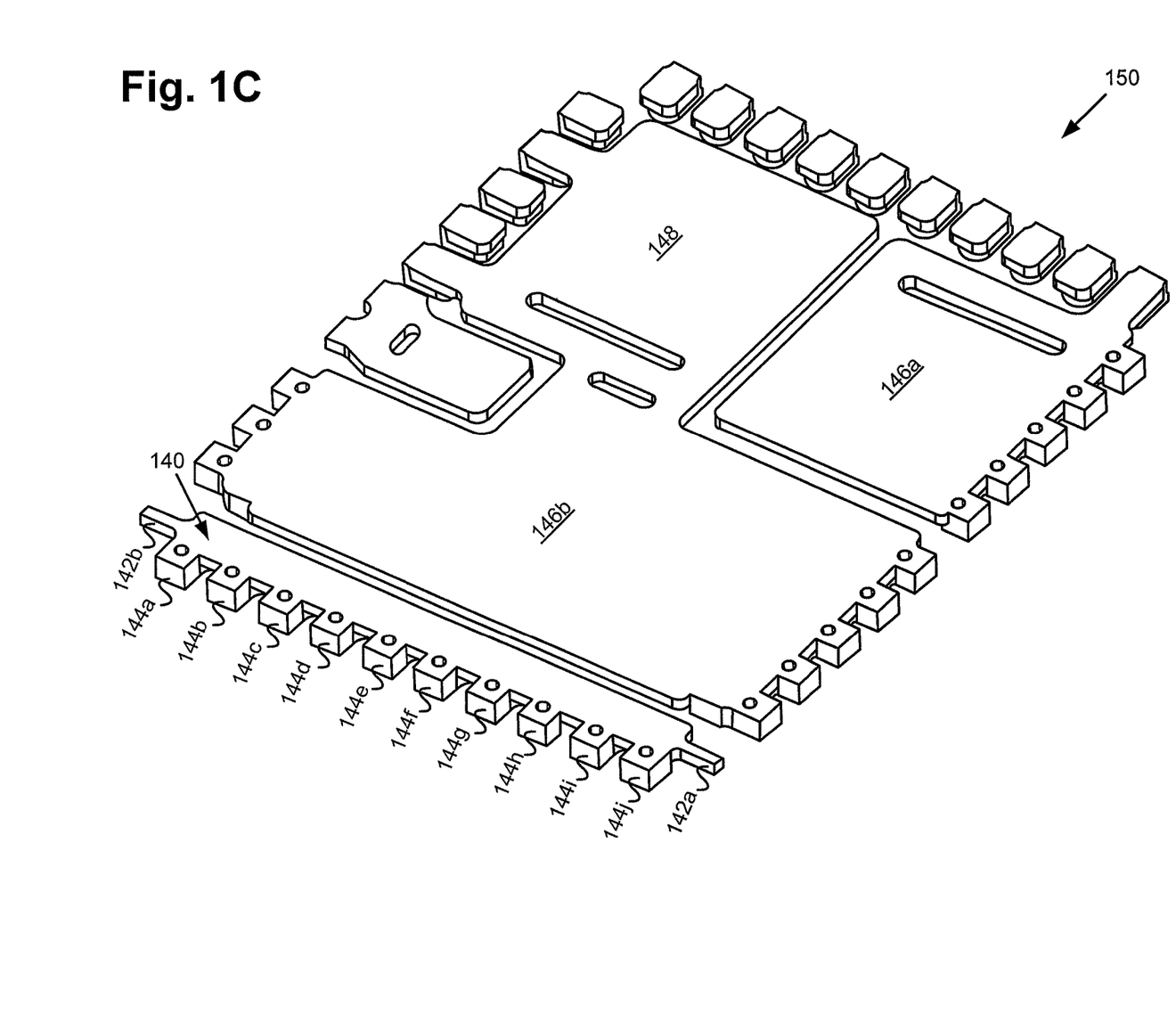
FIG. 1C illustrates a perspective view of a leadframe of a semiconductor package according to one implementation of the present application.

Referring to FIG. 1C, FIG. 1C illustrates a perspective view of a leadframe of a semiconductor package according to one implementation of the present application. As illustrated in FIG. 1C, with similar numerals representing similar features in FIG. 1A, leadframe 150 includes high-side portion 146a for receiving semiconductor device 104, low-side portion 146b for receiving semiconductor device 106, driver IC portion 148 for receiving driver IC 102, clip foot portion 140 for receiving bent portion 118 of conductive clip 108, various I/O terminals and exposed leads. As illustrated in FIG. 1C, clip foot portion 140 is situated along one peripheral edge of leadframe 150. Clip foot portion 140 also includes exposed leads 144a, 144b, 144c, 144d, 144e, 144f, 144g, 144h, 144i and 144j between tie bars 142a and 142b on opposing ends thereof. In addition, leadframe 150 includes other I/O terminals and exposed leads along the other three peripheral edges.

In the present implementation, leadframe 150 can include a material with high thermal and electrical conductivity, such as copper or copper (Cu) alloy. In the present implementation, leadframe 150 is a dual-gauge leadframe, where portions of leadframe 150 retain a full thickness thereof, while the remaining portions of leadframe 150 retain a fraction (e.g., half-etched or quarter-etched) of the full thickness. For instance, high-side portion 146a, low-side portion 146b, driver IC portion 148, and exposed leads 144a, 144b, 144c, 144d, 144e, 144f, 144g, 144h, 144i and 144j are examples of non-etched portions of leadframe 150, while tie bars 142a and 142b are examples of half-etched portions of leadframe 150. The portions of leadframe 150 with the full thickness can remain exposed at its bottom-side after a mold compound encapsulates the semiconductor package.

Figure 1D:
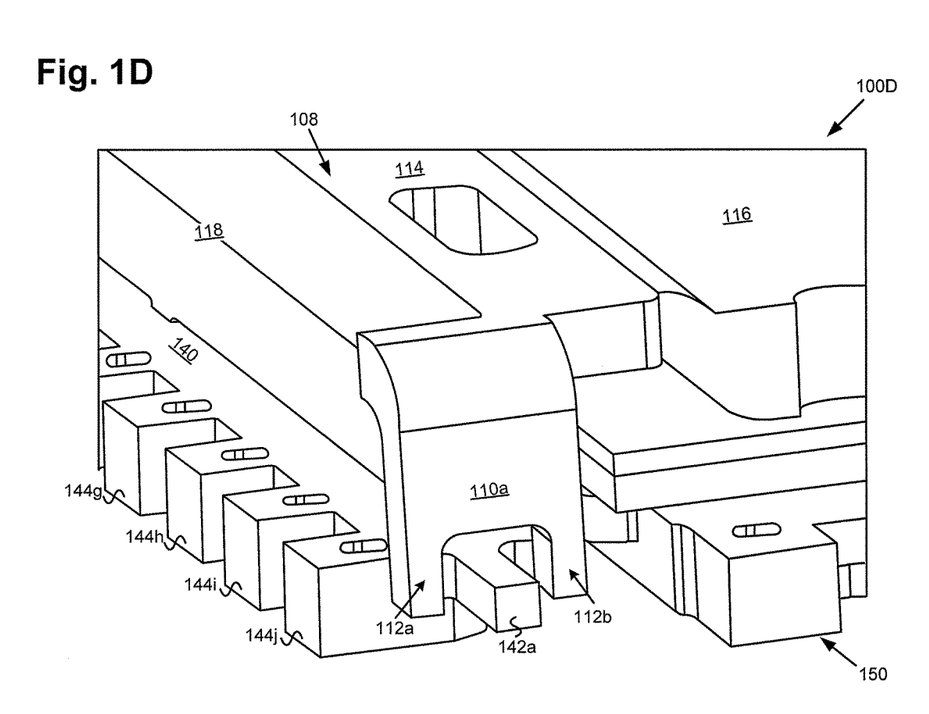
FIG. 1D illustrates an enlarged view of a portion of a semiconductor package according to one implementation of the present application.

Referring to FIG. 1D, FIG. 1D illustrates an enlarged view of a portion of a semiconductor package according to one implementation of the present application. In FIG. 1D, structure 100D shows an enlarged view of a portion of semiconductor package 100A in FIG. 1A. With similar numerals representing similar features in FIG. 1A, structure 100D shows conductive clip 108 over leadframe 150. Conductive clip 108 includes substantially flat portion 116 and bent portion 118, coupled to each other through side foot lock portion 114. Bent portion 118 of conductive clip 108 is electrically and mechanically coupled to clip foot portion 140 of leadframe 150. Side foot lock portion 114 includes lock fork 110a having prongs 112a and 112b around tie bar 142a of clip foot portion 140 of leadframe 150. Prongs 112a and 112b extend below the top surface of tie bar 142a, and are situated on opposite sides of tie bar 142a. As such, any slight rotation of conductive clip 108 with respect to leadframe 150 would result in prong 112a or 112b pressing against tie bar 142a to stop conductive clip 108 from any further rotational movement. As a result of this arrangement, lock fork 110a with prongs 112a and 112b around tie bar 142a secures conductive clip 108 to clip foot portion 140 of leadframe 150. Consequently, the contact points between conductive clip 108 and semiconductor devices 104 and/or 106 would not lose electrical connection due to clip rotation. It should be noted that, as illustrated in FIG. 1D, exposed leads 144g, 144h, 144i and 144j of clip foot portion 140 are shown to have the full thickness of leadframe 150, while tie bar 142a is shown to have a fraction (e.g., half-etched) of the full thickness of leadframe 150.

Figure 1E:
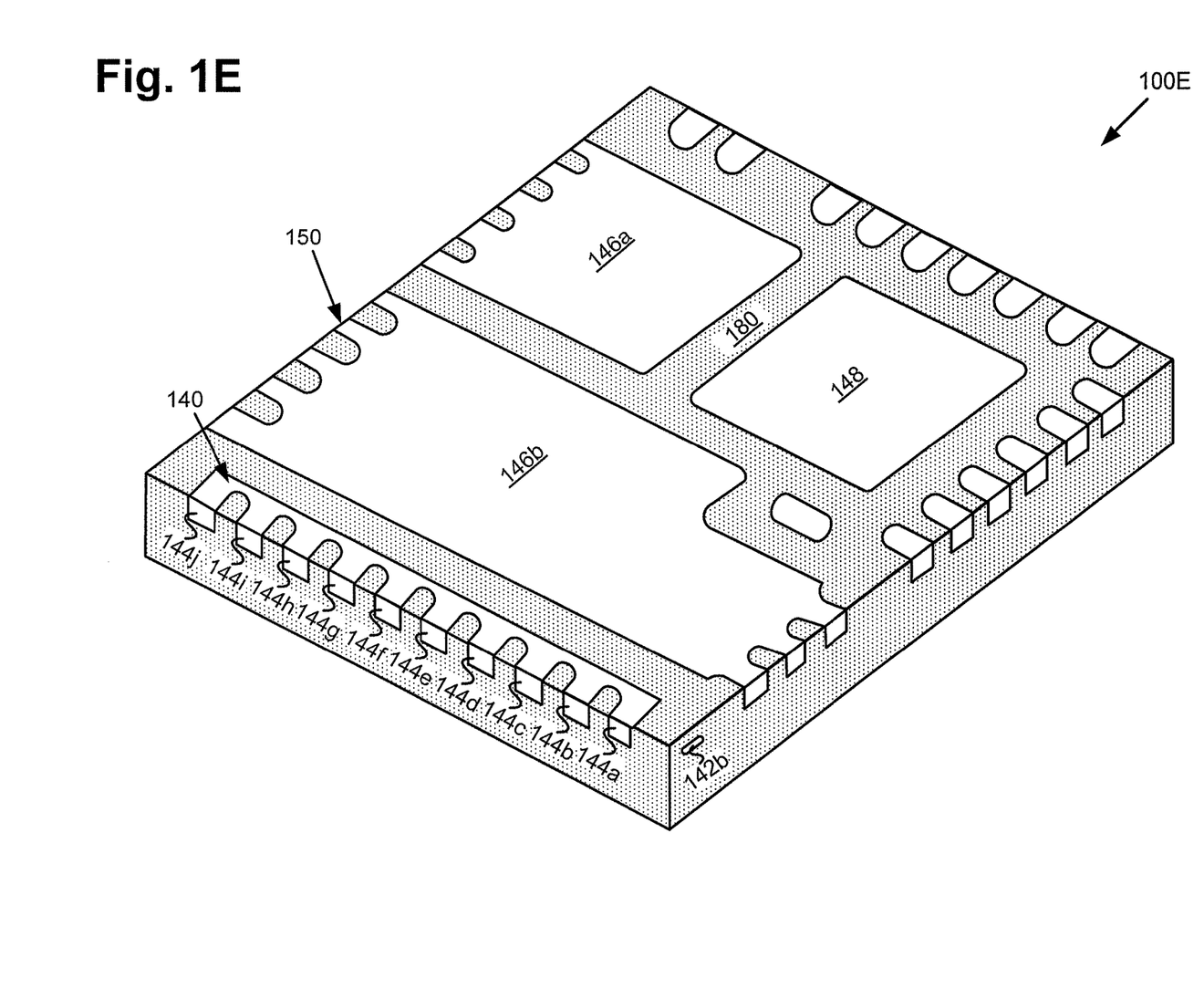
FIG. 1E illustrates a perspective view of a portion of a semiconductor package according to one implementation of the present application.

Referring to FIG. 1E, FIG. 1E illustrates a perspective view of a portion of a semiconductor package according to one implementation of the present application. In FIG. 1E, structure 100E shows a perspective bottom view of an encapsulated semiconductor package, which may correspond to semiconductor package 100A in FIG. 1A. With similar numerals representing similar features in FIG. 1A, structure 100E shows leadframe 150 encapsulated in mold compound 180. In one implementation, mold compound 180 may include an encapsulant that has a high thermal conductivity and/or can achieve high voltage isolation. In another implementation, mold compound 180 can be a plastic that has a low flexural modulus. To provide resilience against package cracking, the height (or thickness) of structure 100E as defined by mold compound 180 may be kept thin.

As illustrated in FIG. 1E, exposed leads 144, high-side portion 146a, low-side portion 146b, driver IC portion 148, various I/O terminals and exposed leads are unetched, thus retain the full thickness of leadframe 150, and are exposed through mold compound 180 on the bottom-side of leadframe 150. As such, exposed leads 144, high-side portion 146a, low-side portion 146b, driver IC portion 148, various I/O terminals and exposed leads are exposed on the bottom-side of leadframe 150 to improve thermal conductivity and/or dissipation. For example, heat generated during operations of driver IC 102, semiconductor device 104 and semiconductor device 106 can be effectively removed from the semiconductor package through driver IC portion 148, high-side portion 146a and low-side portion 146b, respectively, of leadframe 150. As illustrated in FIG. 1E, clip foot portion 140 of leadframe 150 has exposed leads 144 along one peripheral edge of structure 100E, where exposed leads 144 are not covered by mold compound 180 after encapsulation. In addition, tie bar 142b (as well as tie bar 142a not explicitly shown in FIG. 1E) is also exposed along a side surface of structure 100E. It is noted that prongs 112a and 112b of lock fork 110a and prongs 112c and 112d of lock fork 110b are encapsulated by mold compound 180, thus not exposed in structure 100E.

Although a top-plan view of structure 100E is not shown in FIG. 1E, it should be noted that, in one implementation, the semiconductor package (e.g., semiconductor package 100A shown in FIG. 1A) is overmolded on its top-side, such that mold compound 180 fully covers the top-side of leadframe 150, driver IC 102, semiconductor device 104, semiconductor device 106, conductive clip 108, bond wires and various leads and I/O terminals. In another implementation, the semiconductor package (e.g., semiconductor package 100A shown in FIG. 1A) is partially molded on its top-side, such that mold compound 180 partially covers conductive clip 108, in which case, the exposed top surface of conductive clip 108 may be silver plated, for example, to prevent erosion. In yet another implementation, mold compound 180 can be omitted from the semiconductor package (e.g., semiconductor package 100A shown in FIG. 1A).

Figure 2:
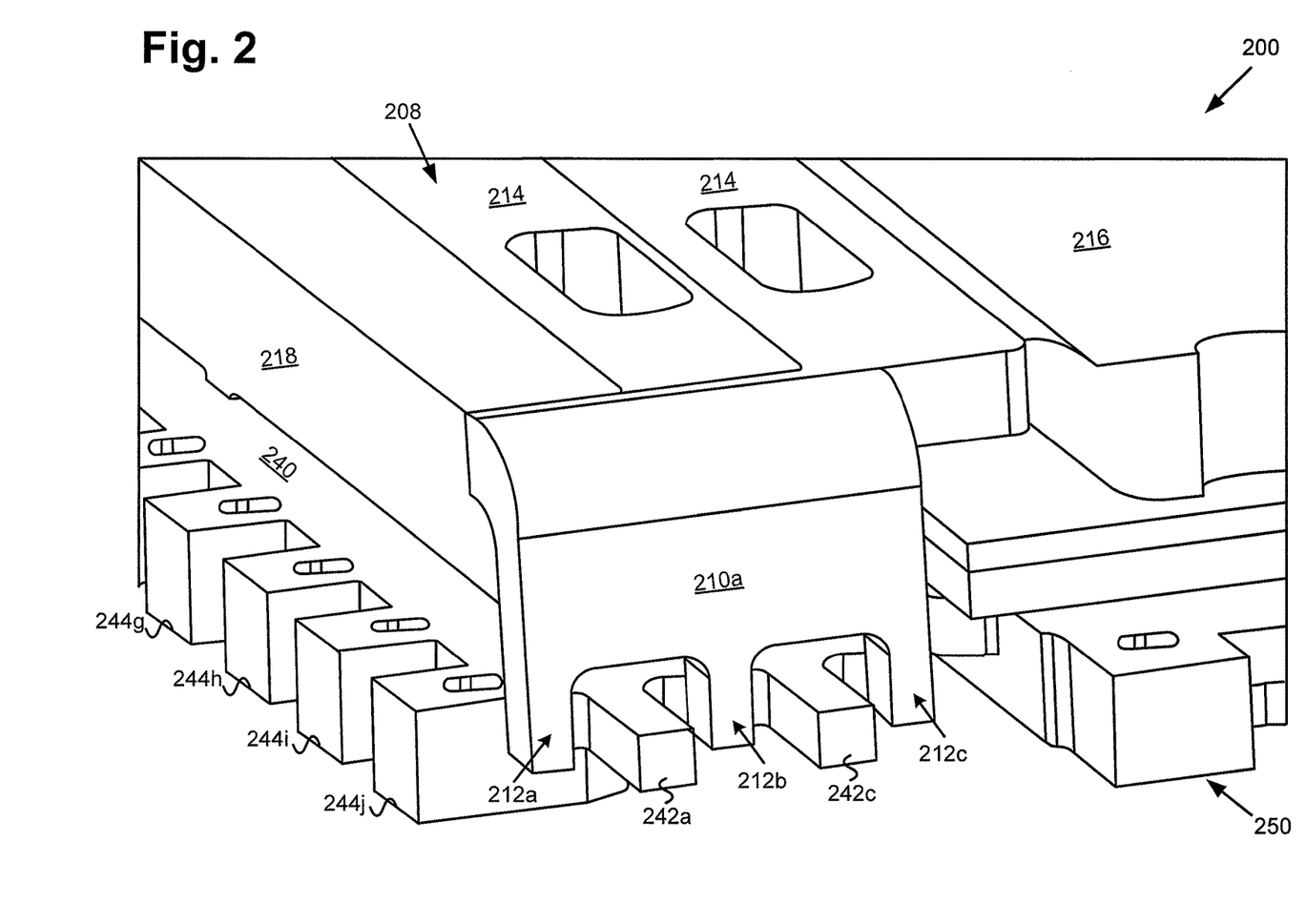
FIG. 2 illustrates a perspective view of a portion of a semiconductor package according to one implementation of the present application.

Referring to FIG. 2, FIG. 2 illustrates an enlarged view of a portion of a semiconductor package according to one implementation of the present application. In FIG. 2, structure 200 illustrates an enlarged view of a portion of a semiconductor package, similar to semiconductor package 100A in FIG. 1A. With similar numerals representing similar features in FIG. 1A, structure 200 shows conductive clip 208 over leadframe 250. Conductive clip 208 includes substantially flat portion 216 and bent portion 218, coupled to each other through side foot lock portion 214. Bent portion 218 of conductive clip 208 is electrically and mechanically coupled to clip foot portion 240 of leadframe 250. Side foot lock portion 214 includes lock fork 210a having prongs 212a, 212b and 212c, where prongs 212a and 212b are around tie bar 242a of clip foot portion 240 of leadframe 250, and prongs 212b and 212c are around tie bar 242c of clip foot portion 240 of leadframe 250. Prongs 212a and 212b extend below the top surface of tie bar 242a, and are situated on opposite sides of tie bar 242a. Prongs 212b and 212c extend below the top surface of tie bar 242c, and are situated on opposite sides of tie bar 242c. As such, any slight rotation of conductive clip 208 with respect to leadframe 250 would result in prong 212a or 212b pressing against tie bar 242a, and/or prong 212b or 212c pressing against tie bar 242c, to stop conductive clip 208 from any further rotational movement. As a result of this arrangement, lock fork 210a with prongs 212a and 212b around tie bar 242a and prongs 212b and 212c around tie bar 242c secures conductive clip 208 to clip foot portion 240 of leadframe 250. Consequently, the contact points between conductive clip 208 and semiconductor devices below would not lose electrical connection due to clip rotation. It should be noted that, as illustrated in FIG. 2, exposed leads 244g, 244h, 244i and 244j of clip foot portion 240 are shown to have the full thickness of leadframe 250, while tie bars 242a and 242c are shown to have a fraction (e.g., half-etched) of the full thickness of leadframe 250.

It should be noted that implementations of the present application can be applied to any clip based semiconductor package, which includes but is not limited to exposed thin qua flat package, power quad flat package, low-profile quad flat package, quad flat no leads package, and metric quad flat package. For example, semiconductor package 100A in FIG. 1A or structure 200 in FIG. 2 may be a 4×4 quad flat no leads package. Ti another implementation, semiconductor package 100A in FIG. 1A or structure 200 in FIG. 2 may be an 8×8 quad flat no leads package.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor package comprising:
   a leadframe having a clip foot portion, said clip foot portion having a first tie bar and a second tie bar;
   a conductive clip situated over said leadframe, said conductive clip including a first lock fork having at least two prongs around said first tie bar so as to secure said conductive clip to said clip foot portion of said leadframe.

2. The semiconductor package of claim 1 wherein said first lock fork is configured to prevent said conductive clip from rotating.

3. The semiconductor package of claim 1 wherein said conductive clip includes a second lock fork having at least two prongs around said second tie bar of said clip foot portion.

4. The semiconductor package of claim 1 wherein said conductive clip is electrically coupled to said clip foot portion of said leadframe.

5. The semiconductor package of claim 1 further comprising a mold compound encapsulating said leadframe and said conductive clip.

6. The semiconductor package of claim 5 wherein said clip foot portion of said leadframe includes exposed leads.

7. The semiconductor package of claim 1 further comprising at least one semiconductor device situated on said leadframe.

8. The semiconductor package of claim 7 wherein said at least one semiconductor device is coupled to a driver integrated circuit situated on said leadframe.

9. A semiconductor package comprising:
   a leadframe having a clip foot portion, said clip foot portion having a first tie bar on a first end and a second tie bar on a second end opposite said first end;
   a conductive clip including a first lock fork around said first tie bar and a second lock fork around said second tie bar.

10. The semiconductor package of claim 9 wherein said first lock fork includes at least two prongs around said first tie bar.

11. The semiconductor package of claim 9 wherein said second lock fork includes at least two prongs around said second tie bar.

12. The semiconductor package of claim 9 wherein said conductive clip is electrically coupled to said clip foot portion of said leadframe.

13. The semiconductor package of claim 9 further comprising a mold compound encapsulating said leadframe and said conductive clip.

14. The semiconductor package of claim 13 wherein said clip foot portion of said leadframe includes exposed leads between said first tie bar and said second tie bar.

15. The semiconductor package of claim 9 further comprising at least one semiconductor device situated on said leadframe.

16. The semiconductor package of claim 15 wherein said at least one semiconductor device is coupled to a driver integrated circuit situated on said leadframe.

17. The semiconductor package of claim 9 wherein said first lock fork includes two prongs around said first tie bar.

18. The semiconductor package of claim 9 wherein said first lock fork includes three prongs around said first tie bar and a third tie bar on said first end of said clip foot portion.

19. The semiconductor package of claim 9 wherein said at least one semiconductor device is selected from the group consisting of a power MOSFET, an insulated gate bipolar transistor (IGBT), a high electron mobility transistor (HEMT), and a diode.

\* \* \* \* \*